US012446168B2

(12) United States Patent
Schattner

(10) Patent No.: US 12,446,168 B2
(45) Date of Patent: Oct. 14, 2025

(54) TAMPER-RESISTANT ENCLOSURE COUPLING SYSTEM

(71) Applicant: SIGNIFY HOLDING B.V., Eindhoven (NL)

(72) Inventor: David Schattner, Newnan, GA (US)

(73) Assignee: SIGNIFY HOLDING B.V., Eindhoven (NL)

( * ) Notice: Subject to any disclaimer, the term of this patent is extended or adjusted under 35 U.S.C. 154(b) by 229 days.

(21) Appl. No.: 18/462,510

(22) Filed: Sep. 7, 2023

(65) Prior Publication Data

US 2024/0090143 A1    Mar. 14, 2024

Related U.S. Application Data

(60) Provisional application No. 63/404,968, filed on Sep. 9, 2022.

(30) Foreign Application Priority Data

Sep. 23, 2022  (EP) ..................................... 22197369

(51) Int. Cl.
*H05K 5/02* (2006.01)
*H05K 5/30* (2025.01)

(52) U.S. Cl.
CPC ......... *H05K 5/0208* (2013.01); *H05K 5/0204* (2013.01); *H05K 5/0221* (2013.01); *H05K 5/30* (2025.01)

(58) Field of Classification Search
CPC ............................ H05K 5/0208; H05K 5/0221
See application file for complete search history.

(56) References Cited

U.S. PATENT DOCUMENTS 4,840,286 A * 6/1989 Heberling ................ H05K 5/15
                                                              361/728
11,920,629 B2 * 3/2024 Koerdt .................. F16B 5/0664
(Continued)

OTHER PUBLICATIONS

Bonenberger, Paul R., "The First Snap-Fit Handbook," Creating and Managing Attachments for Plastics Parts, Hanser Publications, 3rd Edition, 2016 (3 Pages).

(Continued)

*Primary Examiner* — Timothy J Thompson
*Assistant Examiner* — Amol H Patel

(57) ABSTRACT

An enclosure can include a first and second enclosure component, where the first enclosure component can include a first enclosure component side and a snap-fit fastener that extends from the first enclosure component side, where the snap-fit fastener comprises a body with an aperture that traverses therethrough. The second enclosure component can include a second enclosure component side and a ridge that protrudes from the second enclosure component side to form a cavity, where the ridge has a plurality of gaps along its top end. The second enclosure component can also include a catch that protrudes from the second enclosure component side, where the catch is positioned within the inner perimeter of the ridge, and where the catch is configured to be positioned within the aperture formed by the snap-fit fastener and abut against the snap-fit fastener when the snap-fit fastener is disposed within the cavity formed by the ridge.

14 Claims, 10 Drawing Sheets

(56) References Cited

U.S. PATENT DOCUMENTS

| | | | | |
|---|---|---|---|---|
| 2008/0276663 | A1* | 11/2008 | Hu | H05K 5/0221 |
| | | | | 70/2 |
| 2011/0318089 | A1* | 12/2011 | Peng | F16B 5/0635 |
| | | | | 403/9 |
| 2014/0247603 | A1 | 9/2014 | Cruz et al. | |
| 2015/0117946 | A1 | 4/2015 | Suzuki | |
| 2015/0351262 | A1 | 12/2015 | Jorgensen et al. | |
| 2020/0068723 | A1 | 2/2020 | Miklosi | |
| 2024/0040712 | A1* | 2/2024 | Akieda | H04M 1/0262 |
| 2024/0040728 | A1* | 2/2024 | Akieda | H05K 5/061 |

OTHER PUBLICATIONS

"TGB Distributeur De Savon Automatique," Amazon, Feb. 17, 2021, Retrived From Internet: URL: HTTPS://www.amazon.fr/gp/product/b089whq2hg/ref=ppx_yo_dt_b_assin_title_o09_s00?ie=utf8&psc=1, Retrived on Feb. 16, 2023 (3 Pages).

Acuity Brands, Nlight NPP16 EFP, Power/Relay Pack, Family Instructions, URL: https://img.acuitybrands.com/public-assets/catalog/147279/is-npp16-efp-mrb-20201021.pdf?abl_version=05%2f08%2f2023+20%3a56%3a08&DOC_Type=Installation_Instruction_Sheets, Last Visited on Sep. 7, 2023 (3 Pages).

Acuity Brands, Nlight NPP16 EFP, Power/Relay Pack, Specification Sheet, URL: https://img.acuitybrands.com/public-assets/catalog/147279/npp16-efp.pdf?abl_version=05%2f08%2f2023+20%3a56%3a08&DOC_Type=SPEC_SHEET, Last Visited on Sep. 7, 2023 (3 Pages).

* cited by examiner

TAMPER-RESISTANT ENCLOSURE COUPLING SYSTEM

CROSS REFERENCE TO PRIOR APPLICATIONS

This application claims the benefit of U.S. Provisional Patent Application No. 63/404,968, filed on Sep. 9, 2022 and European Patent Application No. 22197369.6, filed on Sep. 23, 2023. These applications are hereby incorporated by reference herein.

TECHNICAL FIELD

The present disclosure relates generally to enclosures, and more particularly to systems, methods, and devices for tamper-resistant enclosure coupling systems.

BACKGROUND

Some enclosures use or require tamper-resistant coupling features that keep the body and cover of those enclosures coupled together permanently or until a specialized tool is used to allow the body and cover to become separated from each other. For example, tamper-resistant coupling features can be required for enclosures that house high voltage components. Some of these tamper-resistant coupling features can be expensive to manufacture. Some of these tamper-resistant coupling features can be easily compromised or defeated by a user in the field, thereby defeating the purpose of having the tamper-resistant coupling features.

CROSS REFERENCE TO PRIOR APPLICATIONS

This application claims the benefit of U.S. Provisional patent Application No. filed on and European Patent Application No. filed on. These applications are hereby incorporated by reference herein.

SUMMARY

In general, in one aspect, the disclosure relates to an enclosure that includes a first enclosure component and a second enclosure component. The first enclosure component of the enclosure can include a first enclosure component side and a snap-fit fastener that extends from the first enclosure component side, where the snap-fit fastener comprises a body with an aperture that traverses therethrough. The second enclosure component of the enclosure can include a second enclosure component side and a ridge that protrudes from the second enclosure component side to form a cavity, where the ridge has an inner perimeter with a shape that is substantially similar to that of an outer perimeter of the snap-fit fastener, where the outer perimeter of the snap-fit fastener is configured to abut against the inner perimeter of the ridge when the snap-fit fastener is positioned within the cavity, and where the ridge has a plurality of gaps along its top end. The second enclosure component of the enclosure can also include a catch that protrudes from the second enclosure component side, where the catch is positioned within the inner perimeter of the ridge, and where the catch is configured to be positioned within the aperture formed by the snap-fit fastener and abut against the snap-fit fastener when the snap-fit fastener is disposed within the cavity formed by the ridge.

In other aspects, the disclosure relates to a tamper-resistant enclosure coupling system for an enclosure can include a snap-fit fastener that extends from a first enclosure component side of a first enclosure component of the enclosure, where the snap-fit fastener includes a body with an aperture that traverses therethrough. The tamper-resistant enclosure can also include a ridge that protrudes from a second enclosure component side of a second enclosure component of the enclosure to form a cavity, where the ridge has an inner perimeter with a shape that is substantially similar to that of an outer perimeter of the snap-fit fastener, where the outer perimeter of the snap-fit fastener is configured to abut against the inner perimeter of the ridge when the snap-fit fastener is positioned within the cavity, and where the ridge has a plurality of gaps along its top end. The tamper-resistant enclosure can further include a catch that protrudes from the second enclosure component side, where the catch is positioned within the inner perimeter of the ridge, and where the catch is configured to be positioned within the aperture of the snap-fit fastener and abut against the snap-fit fastener when the snap-fit fastener is disposed within the cavity formed by the ridge.

These and other aspects, objects, features, and embodiments will be apparent from the following description and the appended claims.

BRIEF DESCRIPTION OF THE DRAWINGS

The drawings illustrate only example embodiments and are therefore not to be considered limiting in scope, as the example embodiments may admit to other equally effective embodiments. The elements and features shown in the drawings are not necessarily to scale, emphasis instead being placed upon clearly illustrating the principles of the example embodiments. Additionally, certain dimensions or positions may be exaggerated to help visually convey such principles. In the drawings, reference numerals designate like or corresponding, but not necessarily identical, elements.

DETAILED DESCRIPTION

Figure 1:
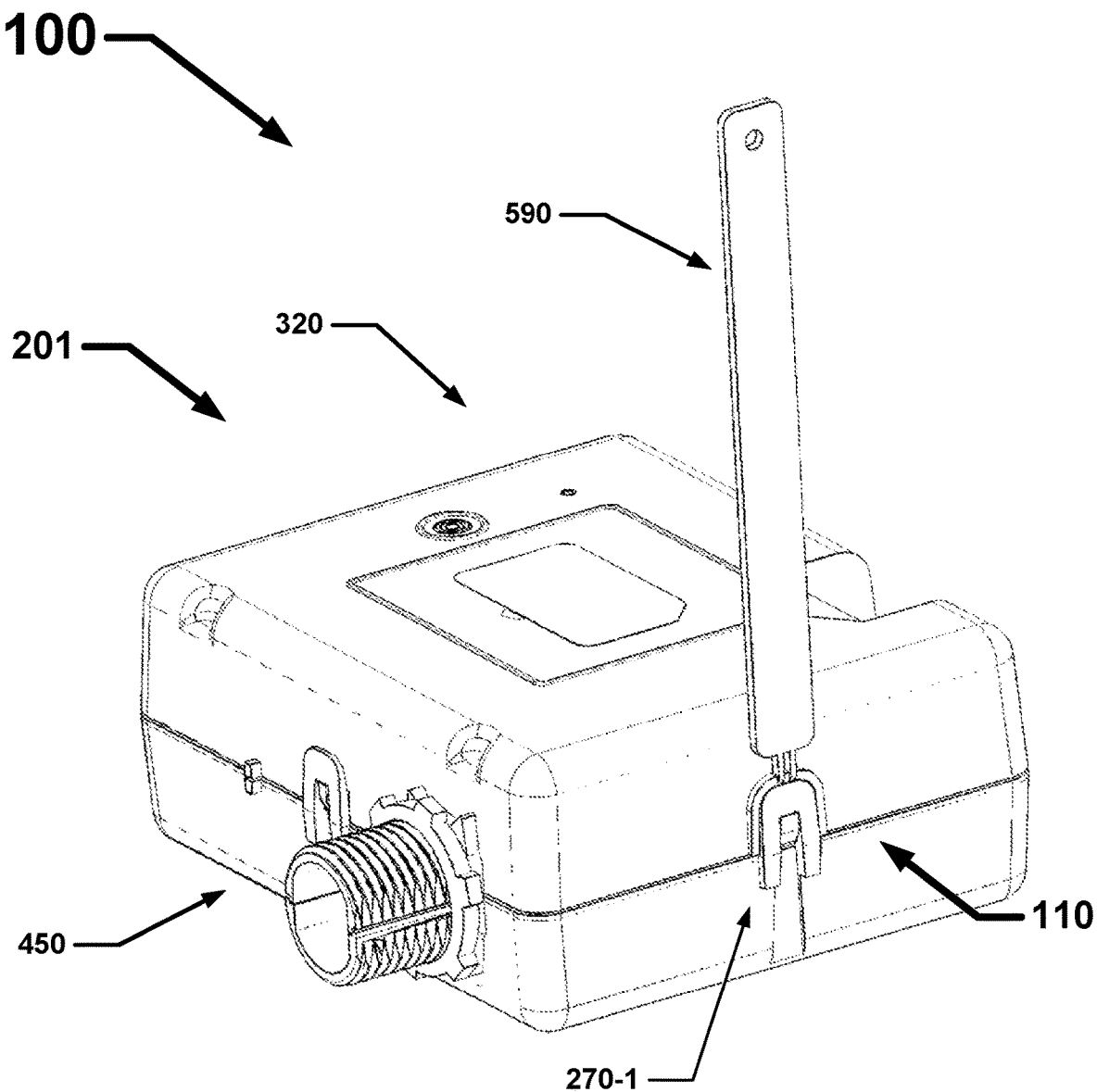
FIG. 1 shows an enclosure assembly that includes a tamper-resistant enclosure coupling system according to certain example embodiments.

In general, example embodiments provide systems, methods, and devices for tamper-resistant enclosure coupling systems. Example embodiments can provide a number of benefits. Such benefits can include, but are not limited to, ease of installation, increased reliability, user control, and simple configurability. Example embodiments can be used with any type of enclosure. Examples of such enclosures can include, but are not limited to, light fixture enclosures (e.g., housings), junction boxes, control panels, and fire protection enclosures.

Enclosures with example tamper-resistant coupling systems can be located in one or more of any of a number of environments. Examples of such environments can include, but are not limited to, indoors, outdoors, a parking garage, a kitchen or cooking space, a hallway, an entertainment room, an office space, a manufacturing plant, a warehouse, and a storage facility, any of which can be climate-controlled or non-climate-controlled. In some cases, enclosures with the example embodiments discussed herein can be located in any type of hazardous environment, including but not limited to an airplane hangar, a drilling rig (as for oil, gas, or water), a production rig (as for oil or gas), a refinery, a chemical plant, a power plant, a mining operation, a wastewater treatment facility, and a steel mill. In some cases, enclosures with the example embodiments discussed herein can qualify as a Class 1 enclosure as that designation is known by those of ordinary skill in the art.

Enclosures with example tamper-resistant coupling systems can be directly or indirectly mounted onto any of a number of different structures. Such structures can include, but are not limited to, a beam, a back panel, drywall, wood studs, concrete, and ceiling tile. A user may be any person that interacts with enclosures with tamper-resistant coupling systems. Examples of a user may include, but are not limited to, an engineer, an electrician, an instrumentation and controls technician, a mechanic, an operator, a property manager, a homeowner, a plant manager, a tenant, an employee, a consultant, a contractor, and a manufacturer's representative.

Enclosures with example tamper-resistant coupling systems (including portions thereof) can be made of one or more of a number of suitable materials to allow the enclosures to meet certain standards and/or regulations while also maintaining durability in light of the one or more conditions under which the enclosures and/or other associated components of the enclosures can be exposed. Examples of such materials can include, but are not limited to, aluminum, stainless steel, fiberglass, glass, polymer (e.g., plastic), ceramic, and rubber.

Example tamper-resistant coupling systems, or portions or components thereof, described herein can be made from a single piece (as from a mold, injection mold, die cast, or extrusion process). In addition, or in the alternative, example tamper-resistant coupling systems (including portions or components thereof) can be made from multiple pieces that are mechanically coupled to each other. In such a case, the multiple pieces can be mechanically coupled to each other using one or more of a number of coupling methods, including but not limited to epoxy/adhesive/glue, welding, fastening devices, compression fittings, mating threads, snap fittings, and slotted fittings. One or more pieces that are mechanically coupled to each other can be coupled to each other in one or more of a number of ways, including but not limited to fixedly, hingedly, removeably, slidably, and threadably.

Components and/or features described herein can include elements that are described as coupling, fastening, securing, abutting against, in communication with, or other similar terms. Such terms are merely meant to distinguish various elements and/or features within a component or device and are not meant to limit the capability or function of that particular element and/or feature. For example, a feature described as a "coupling feature" can couple, secure, fasten, abut against, and/or perform other functions aside from merely coupling.

A coupling feature (including a complementary coupling feature) as described herein can allow one or more components and/or portions of an example tamper-resistant coupling system to become coupled, directly or indirectly, to one or more other components of the tamper-resistant coupling system and/or to some other component of an enclosure. A coupling feature can include, but is not limited to, a clamp, a portion of a hinge, an aperture, a recessed area, a protrusion, a hole, a slot, a tab, a detent, and mating threads. One portion of an example tamper-resistant coupling system can be coupled to a component of the tamper-resistant coupling system and/or to an enclosure by the direct use of one or more coupling features.

In addition, or in the alternative, a portion of an example tamper-resistant coupling system can be coupled to another component of the tamper-resistant coupling system and/or to an enclosure using one or more independent devices that interact with one or more coupling features disposed on a component of the tamper-resistant coupling system. Examples of such devices can include, but are not limited to, a pin, a hinge, a fastening device (e.g., a bolt, a screw, a rivet), epoxy, glue, adhesive, and a spring. One coupling feature described herein can be the same as, or different than, one or more other coupling features described herein. A complementary coupling feature as described herein can be a coupling feature that mechanically couples, directly or indirectly, with another coupling feature.

In the foregoing figures showing example embodiments of tamper-resistant coupling systems for enclosures, one or more of the components shown may be omitted, repeated, and/or substituted. Accordingly, example embodiments of tamper-resistant coupling systems for enclosures should not be considered limited to the specific arrangements of components shown in any of the figures. For example, features shown in one or more figures or described with respect to one embodiment can be applied to another embodiment associated with a different figure or description.

In certain example embodiments, enclosures having example tamper-resistant coupling systems are subject to meeting certain standards and/or requirements. For example, the National Electric Code (NEC), the National Electrical Manufacturers Association (NEMA), the International Electrotechnical Commission (IEC), the Federal Communication Commission (FCC), Underwriters Laboratories (UL), and the Institute of Electrical and Electronics Engineers (IEEE) set standards as to electrical enclosures, wiring, and electrical connections. Use of example embodiments described herein meet (and/or allow the enclosures to meet) such standards when applicable.

If a component of a figure is described but not expressly shown or labeled in that figure, the label used for a corresponding component in another figure can be inferred to that component. Conversely, if a component in a figure is labeled but not described with respect to that figure, the description for such component can be substantially the same as the description for a corresponding component in another figure. The numbering scheme for the various components in the figures herein is such that each component is a three-digit number, and corresponding components in other figures have the identical last two digits.

In addition, a statement that a particular embodiment (e.g., as shown in a figure herein) does not have a particular feature or component does not mean, unless expressly stated, that such embodiment is not capable of having such feature or component. For example, for purposes of present or future claims herein, a feature or component that is described as not being included in an example embodiment shown in one or more particular drawings is capable of being included in one or more claims that correspond to such one or more particular drawings herein.

Example embodiments of tamper-resistant coupling systems for enclosures will be described more fully hereinafter with reference to the accompanying drawings, in which example embodiments of tamper-resistant coupling systems for enclosures are shown. Tamper-resistant coupling systems for enclosures may, however, be embodied in many different forms and should not be construed as limited to the example embodiments set forth herein. Rather, these example embodiments are provided so that this disclosure will be thorough and complete, and will fully convey the scope of tamper-resistant coupling systems for enclosures to those of ordinary skill in the art Like, but not necessarily the same, elements (also sometimes called components) in the various figures are denoted by like reference numerals for consistency.

Terms such as "first", "second", "above", "below", "inner", "outer", "distal", "proximal", "end", "top", "bottom", "upper", "lower", "side", "left", "right", "front", "rear", and "within", when present, are used merely to distinguish one component (or part of a component or state of a component) from another. Such terms are not meant to denote a preference or a particular orientation. Such terms are not meant to limit embodiments of tamper-resistant coupling systems for enclosures. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 2A:
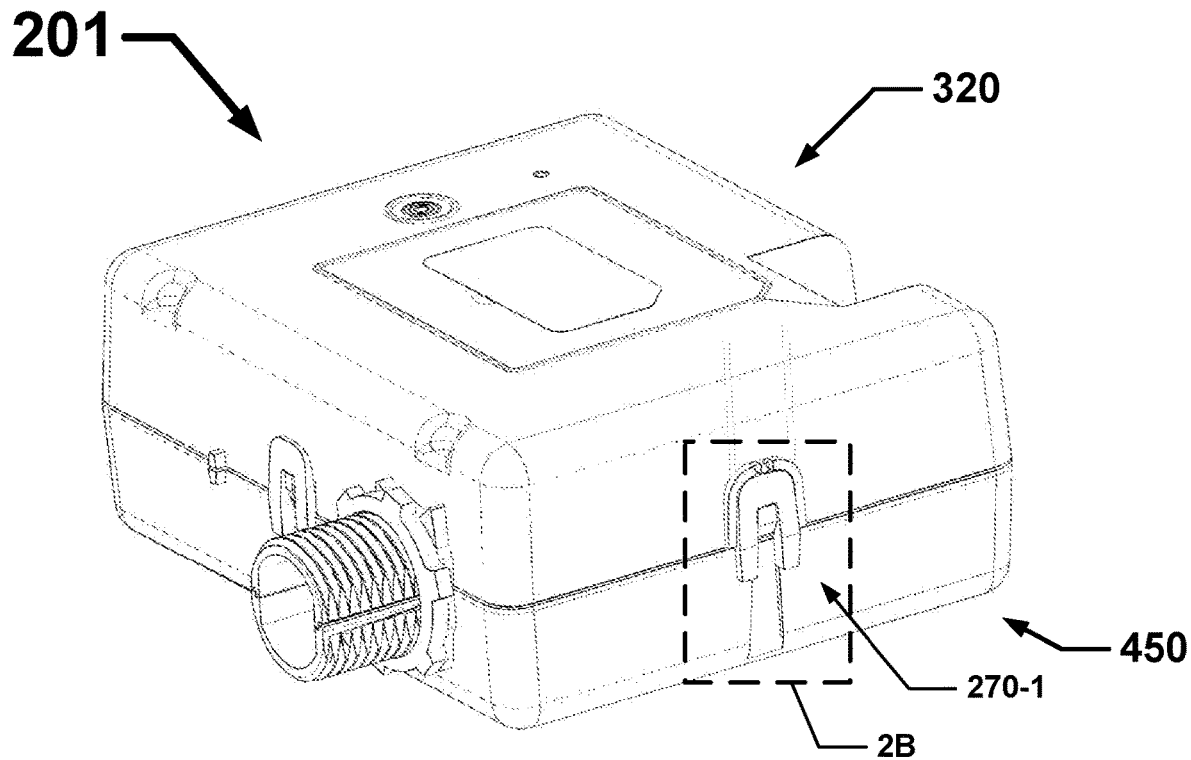
FIGS. 2A through 2D show various views of the enclosure of FIG. 1 according to certain example embodiments.
Figure 2B:
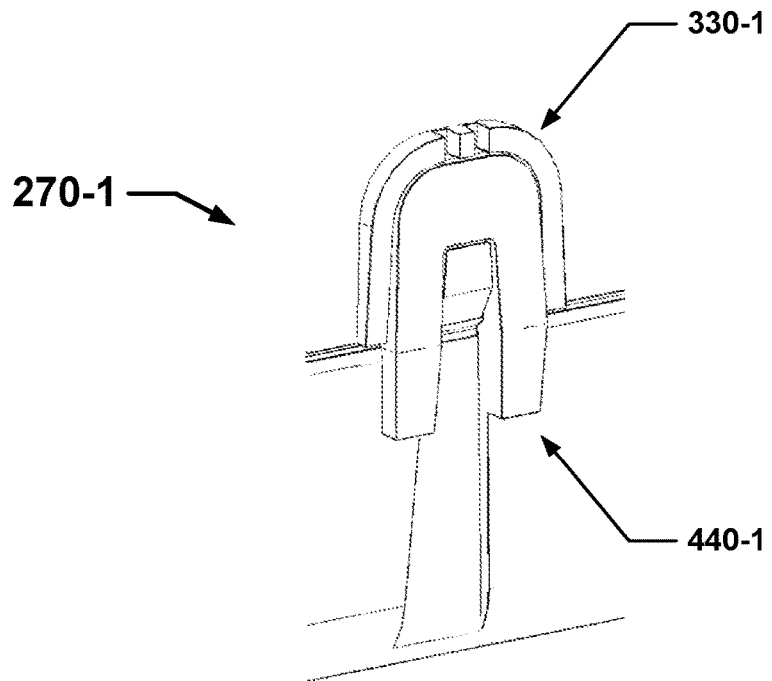
Figure 2C:
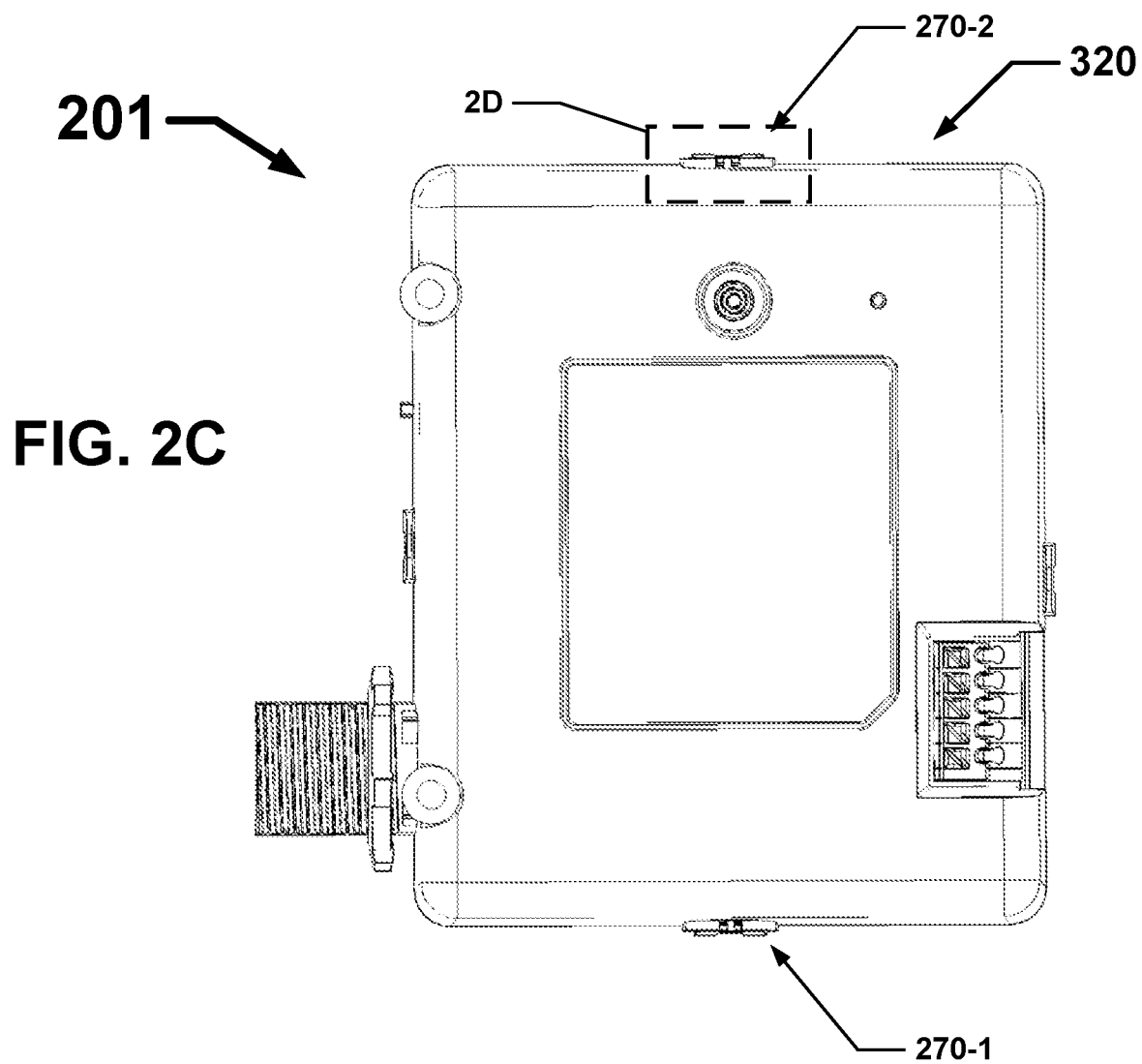
Figure 2D:
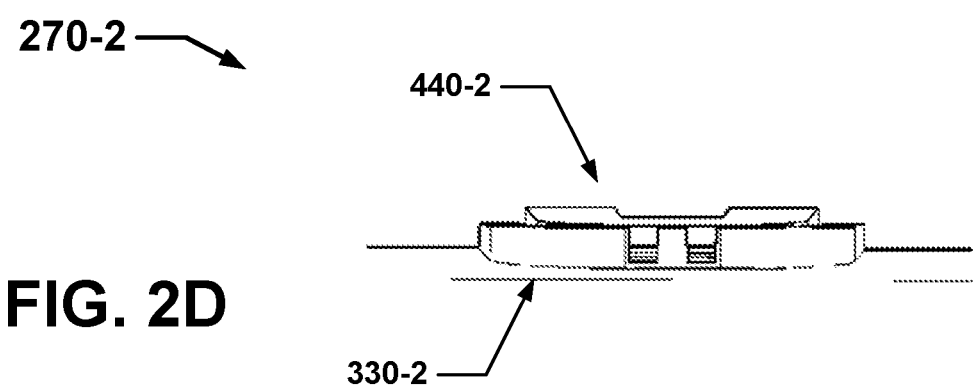

FIG. 1 shows enclosure assembly 100 that includes a tamper-resistant enclosure coupling system 110 according to certain example embodiments. In addition to the tamper-resistant enclosure coupling system 110, the enclosure assembly 100 of FIG. 1 includes an enclosure 201. The enclosure 201 includes an enclosure cover 320 and an enclosure body 450. The enclosure 201 can also include additional features and/or components, including but not limited to a conduit receiver (shown in FIG. 1), receivers for sensor devices, and labeling. The example tamper-resistant enclosure coupling system 110 includes a tool 590 and one or more tamper-resistant coupling pairs 270 (in this case, tamper-resistant coupling pair 270-1 is shown in FIG. 1). FIGS. 2A through 2D show various views of the enclosure 201 of FIG. 1 according to certain example embodiments. Specifically, FIG. 2A shows a top-side perspective view of the enclosure 201. FIG. 2B shows a detailed view of part of the enclosure 201 of FIG. 2A. FIG. 2C shows a top view of the enclosure 201. FIG. 2D shows a detailed view of part of the enclosure 201 of FIG. 2C.

Figure 3A:
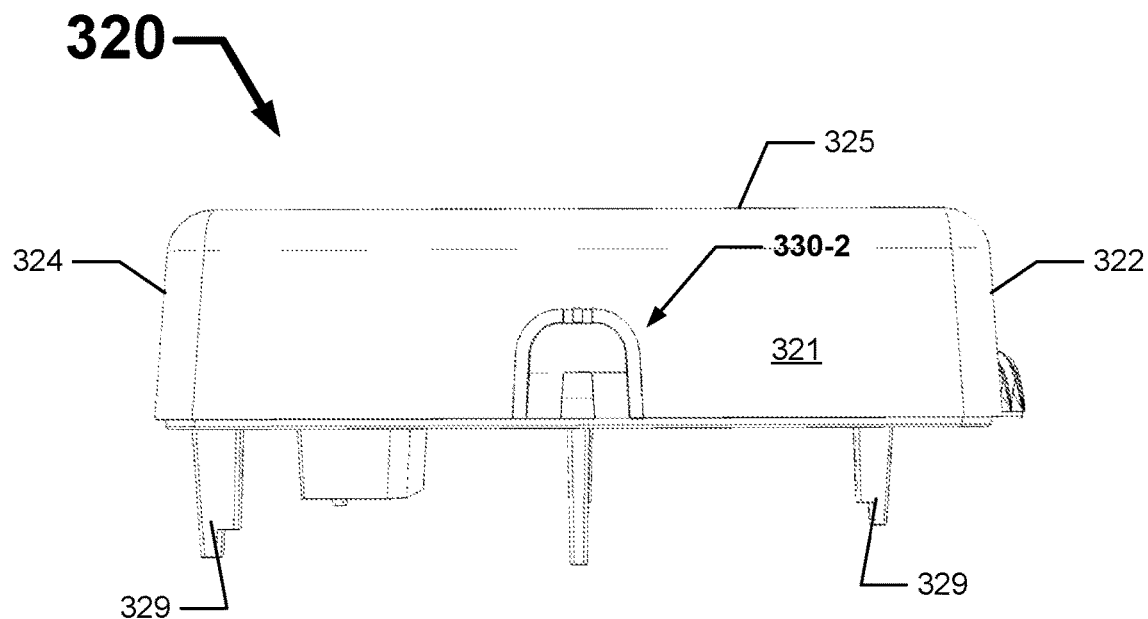
FIGS. 3A through 3G show various views of the enclosure cover of the enclosure of FIG. 1 according to certain example embodiments.
Figure 3B:
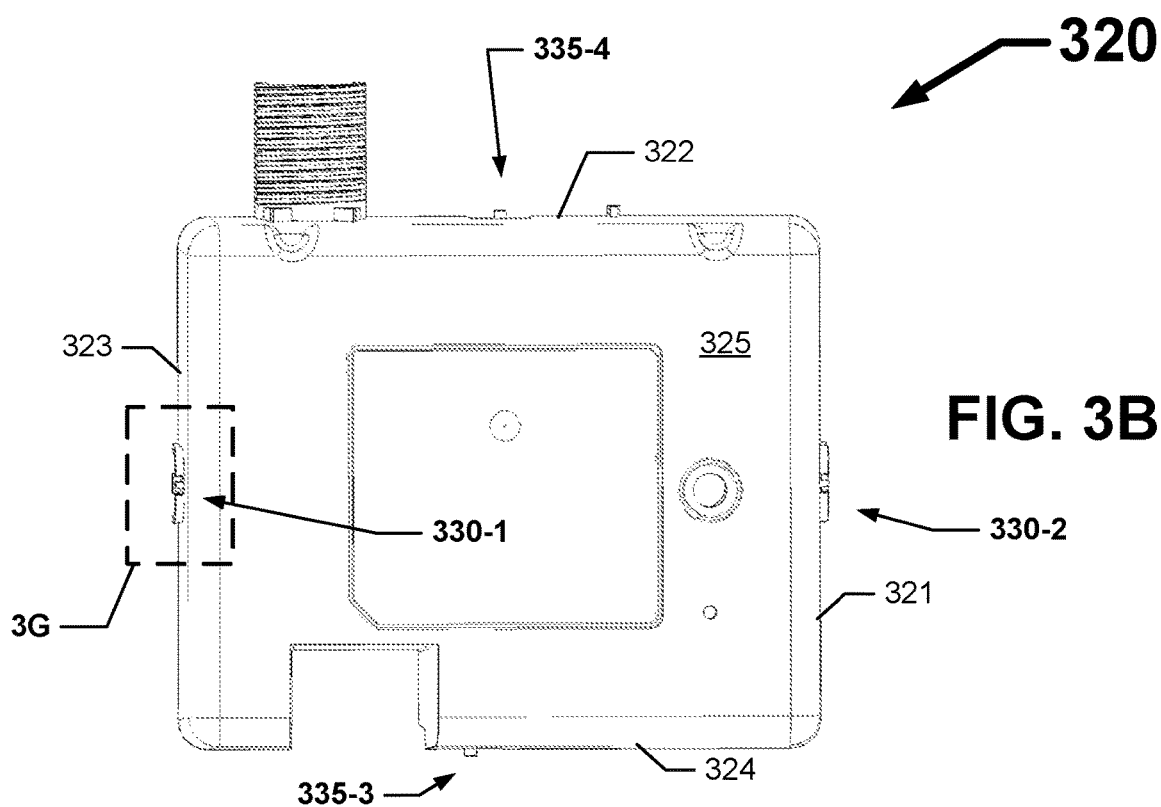
Figure 3C:
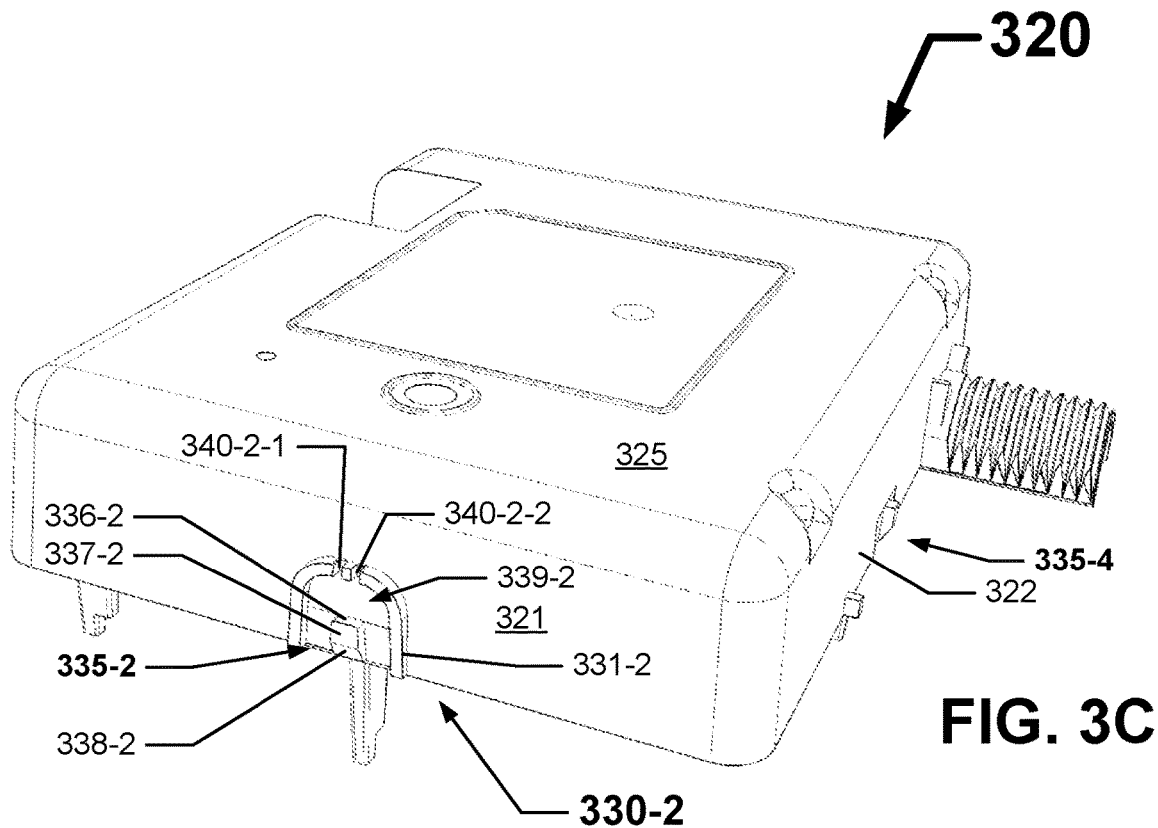
Figure 3D:
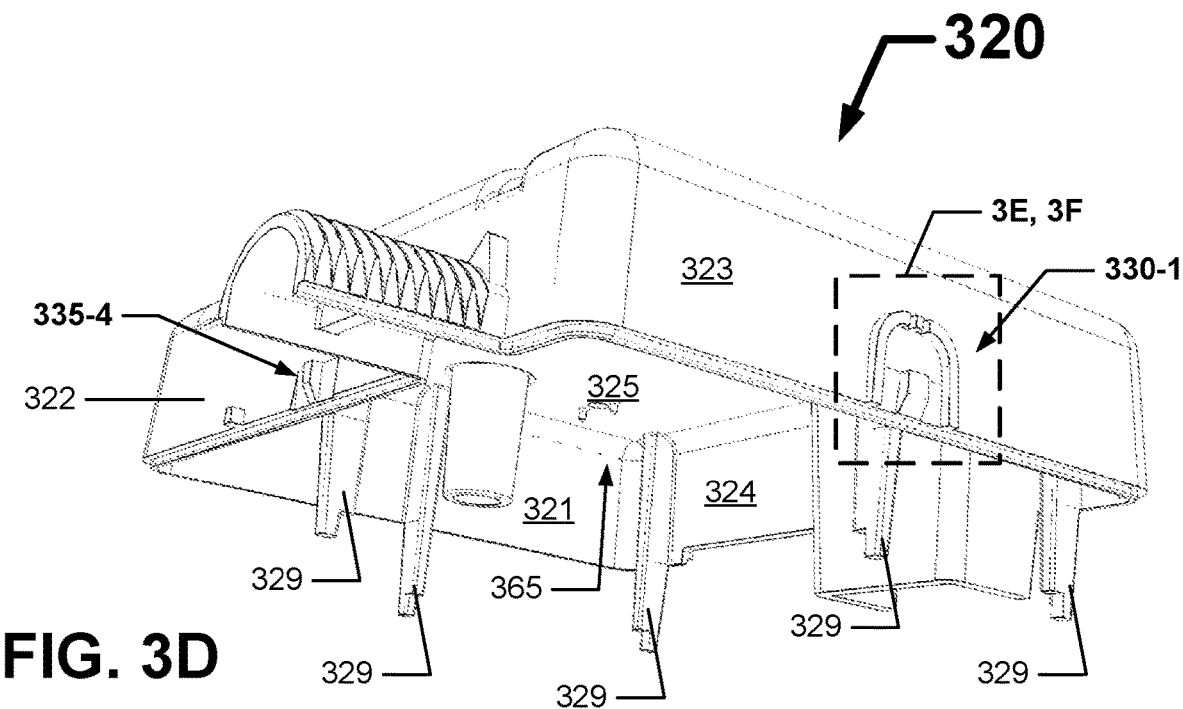
Figure 3E:
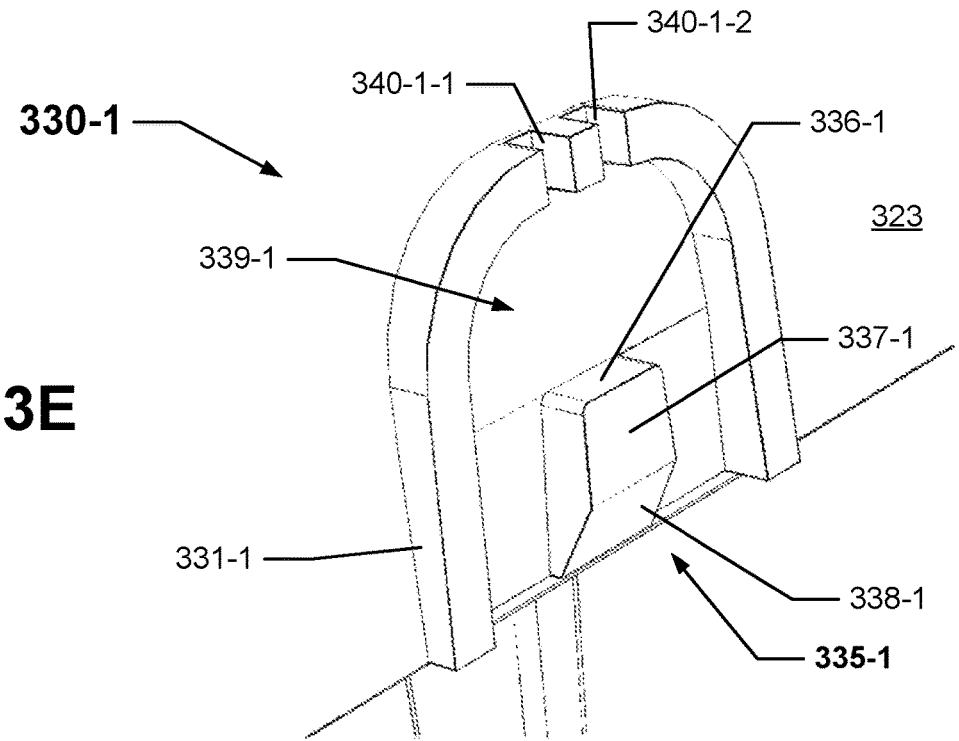
Figure 3F:
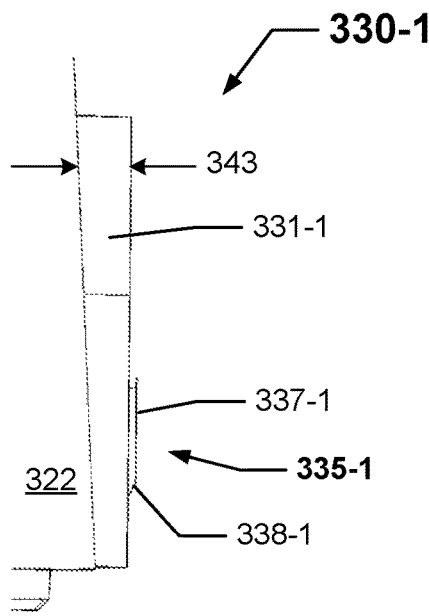
Figure 3G:
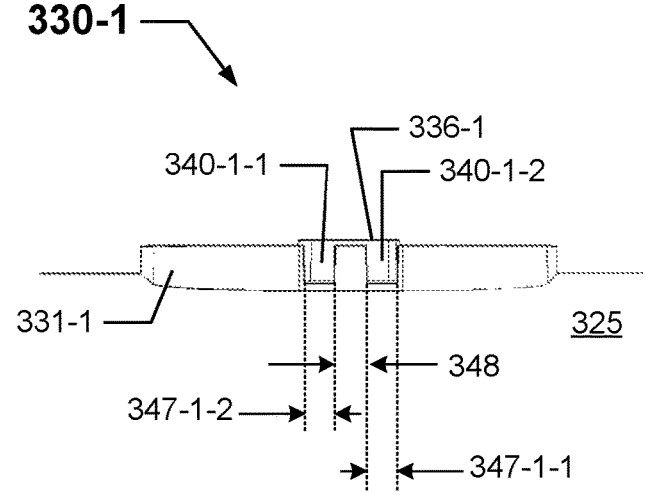

FIGS. 3A through 3G show various views of the enclosure cover 320 of the enclosure 201 of FIG. 1 according to certain example embodiments. Specifically, FIG. 3A shows a side view of the enclosure cover 320. FIG. 3B shows a top view of the enclosure cover 320. FIG. 3C shows a top-side perspective view of the enclosure cover 320. FIG. 3D shows another top-side perspective view of the enclosure cover 320. FIG. 3E shows a detailed perspective view of a ridge 330-1 and catch 335-1. FIG. 3F shows a detailed side view of a ridge 330-1 and catch 335-1. FIG. 3G shows a detailed top view of a ridge 330-1 and catch 335-1.

Figure 4A:
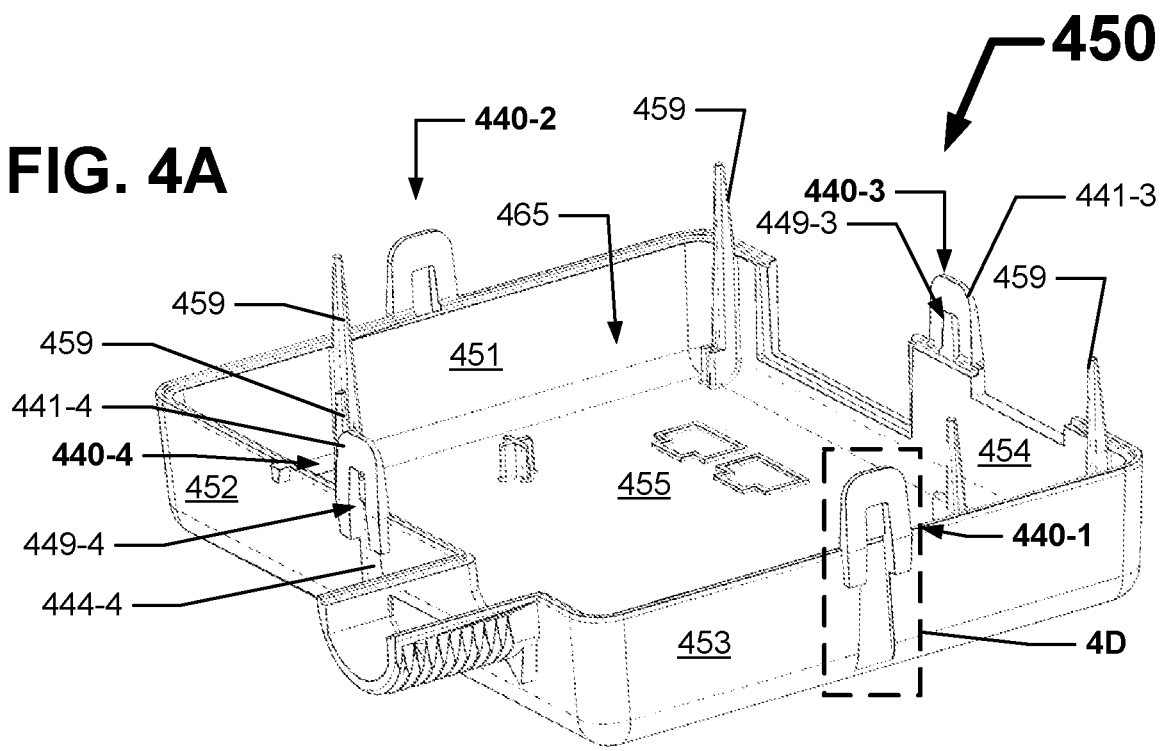
FIGS. 4A through 4D show various views of the enclosure body of the enclosure of FIG. 1 according to certain example embodiments.
Figure 4B:
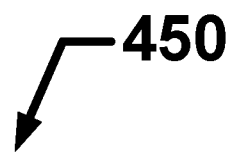
Figure 4C:
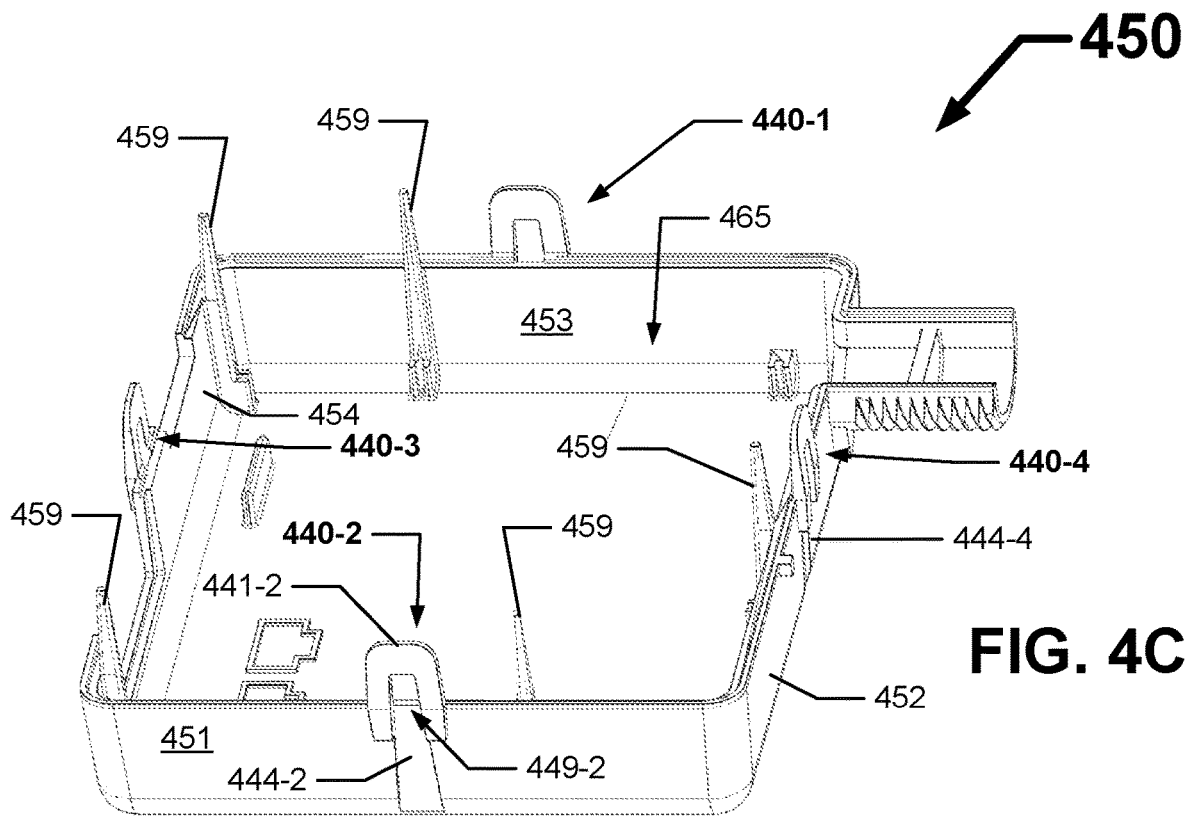
Figure 4D:
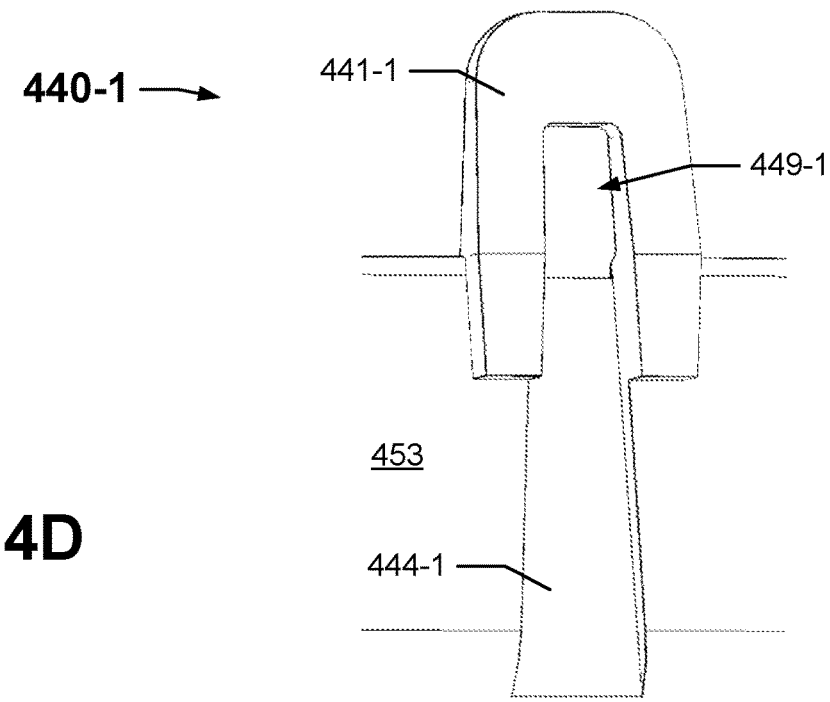
Figure 5A:
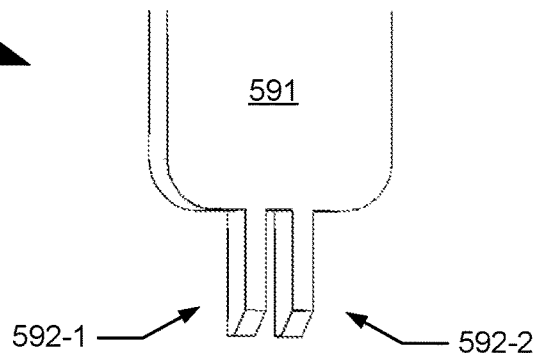
FIGS. 5A through 5C show various views of the tool of the tamper-resistant enclosure coupling system of FIG. 1 according to certain example embodiments.
Figure 5B:
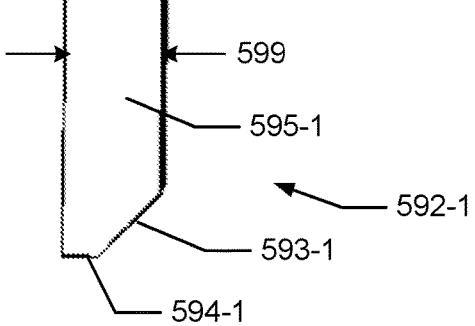
Figure 5C:
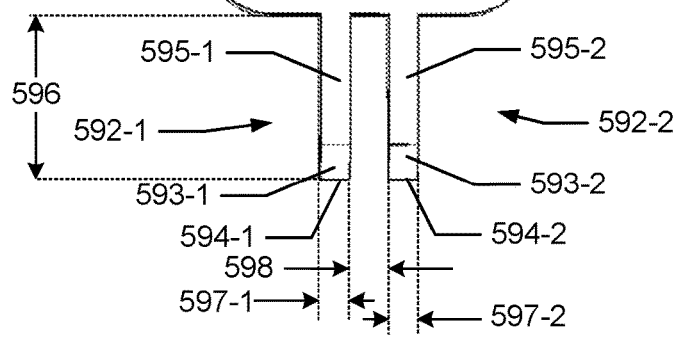

FIGS. 4A through 4D show various views of the enclosure body 450 of the enclosure 201 of FIG. 1 according to certain example embodiments. Specifically, FIG. 4A shows a top-side perspective view of the enclosure body 450. FIG. 4B shows a side view of the enclosure body 450. FIG. 4C shows another top-side perspective view of the enclosure body 450. FIG. 4D shows a detailed view of a snap-fit fastener 440. FIGS. 5A through 5C show various views of the tool 590 of the tamper-resistant enclosure coupling system 110 of FIG. 1 according to certain example embodiments. Specifically, FIG. 5A shows a side-front perspective view of the tool 590. FIG. 5B shows a side view of the tool 590. FIG. 5C shows a front view of the tool 590.

Referring to FIGS. 1 through 5C, the enclosure cover 320 (more generally referred to herein sometimes as an enclosure component) and the enclosure body 450 (also more generally referred to herein sometimes as an enclosure component) are configured to be coupled to each other to form a cavity in which one or more components (e.g., electrical cables, controllers, circuit boards, batteries, timers, power supplies) can be positioned. In some cases, the assembled enclosure 201 have no openings or outlets. In other cases, as in this example, the assembled enclosure 201 has one or more openings and/or outlets (e.g., a conduit receiver) that are configured to receive a conduit, a sensor device, and/or some other component of the enclosure 201. As a specific example, if the enclosure 201 includes a conduit receiver, the conduit receiver can be configured to receive a conduit so that one or more electrical cables can be partly disposed within the cavity of the enclosure 201. When an electrical cable terminates with a component (e.g., a terminal block, a power supply, a communication device, a controller) inside the cavity of the enclosure 201, electrical power and/or electrical signals (e.g., communication signals, data signals) can flow to and/or from one or more components within the cavity of the enclosure 201.

In some cases, as in this example, the enclosure 201 is configured to remain closed unless a user has a particular, specialized tool 590 to open the enclosure 201. In this way, the components within the enclosure 201 remain undisturbed and, in some cases, free from contaminants (e.g., dust, moisture) outside the enclosure. The specialized tool 590 can be used to open each tamper-resistant coupling pair 270 of the enclosure 201, where each tamper-resistant coupling pair 270 is part of the tamper-resistant enclosure coupling system 110. In this case, the enclosure 201 has two tamper-resistant coupling pairs 270 (tamper-resistant coupling pair 270-1 and tamper-resistant coupling pair 270-2).

The enclosure cover 320 of the enclosure 201 can have any of a number of features and/or configurations. For example, in this case, the enclosure cover 320 has five walls. Specifically, the enclosure cover 320 has a top wall 325, a left side wall 321, a front wall 322, a right side wall 323, and a rear wall 324. As referred to herein, the left side wall 321, the front wall 322, the right side wall 323, and the rear wall 324 can collectively be called side walls and individually as a side wall or a side. Also, the top wall 325, the left side wall 321, the front wall 322, the right side wall 323, and the rear wall 324 can collectively be referred to as the body of the enclosure cover 320.

This configuration of the enclosure cover 320 in this case as a rectangular cuboid with an open-sided bottom. The body of the enclosure cover 320 forms a cavity 365, inside of which the components of the enclosure 201 can be disposed when the enclosure cover 320 and the enclosure body 450 are coupled to each other. In alternative embodiments, the enclosure cover 320 can have one side (as when the enclosure cover 320 is in the shape of a cylinder), three sides, or more than four sides. The top wall 325 and/or one or more of the side walls of the enclosure cover 320 can be substantially planar, as in this case. Alternatively, the top wall 325 and/or one or more of the side walls of the enclosure cover 320 can be anti-planar (e.g., curved, arched). For example, if the enclosure cover 320 is cylindrical in shape, then the top wall 325 can be substantially planar, and the side wall can be curved. As another example, if the enclosure cover 320 is semi-spherical in shape, then the enclosure cover 320 has only one wall.

The bottom edge of one or more of the sides (e.g., the left side wall 321, the front wall 322, the right side wall 323, the rear wall 324) of the enclosure cover 320 can include one or more features (e.g., a channel for a sealing member (e.g., a gasket, silicone, an O-ring)) that help control the environment within the cavity 365 when the enclosure cover 320 is coupled to the enclosure body 450 and/or help align the enclosure cover 320 with respect to the enclosure body 450 when the enclosure cover 320 is coupled to the enclosure body 450.

The enclosure cover 320 can also include one or more standoffs 329 that extend downward within the cavity 365 from the inner surface of the top wall 325. The standoffs 329 can help align the enclosure cover 320 with respect to the enclosure body 450 when the enclosure cover 320 is coupled to the enclosure body 450. In this case, the enclosure cover 320 has 5 standoffs 329. Depending on the purpose of the enclosure 201, the enclosure cover 320 can additionally or alternatively have one or more other features that are not discussed here.

As discussed above, the enclosure cover 320 includes part of one or more tamper-resistant coupling pairs 270 of the tamper-resistant enclosure coupling system 110. Specifically, in this case, the enclosure cover 320 includes two ridges 330 (ridge 330-1 and ridge 330-2) and two catches 335 (catch 335-1 and catch 335-2) that are part of the tamper-resistant enclosure coupling system 110. Ridge 330-1 and catch 335-1 are part of one tamper-resistant coupling pair 270-1, and ridge 330-2 and catch 335-2 are part of the other tamper-resistant coupling pair 270-2 in this example. As discussed above, the enclosure 201 can alternatively have only one tamper-resistant coupling pair 270 or at least three tamper-resistant coupling pairs 270.

In some cases, as in this example, the enclosure cover 320 can have more ridges 330 and/or catches 335 than the number of tamper-resistant coupling pairs 270. In this case, the enclosure cover 320 has two ridges 330 (ridge 330-1 and ridge 330-2) and four catches 335 (catch 335-1, catch 335-2, catch 335-3, and catch 335-4), where ridge 330-1, ridge 330-2, catch 335-1, and catch 335-2 are part of the tamper-resistant enclosure coupling system 110, and catch 335-3 and catch 335-4 are not part of the tamper-resistant enclosure coupling system 110.

Each ridge 330 is configured to set an outer boundary of a tamper-resistant coupling pair 270, receive a snap-fit fastener 440 (discussed below), and provide access for the specialized tool 590 to disengage the snap-fit fastener 440 from the catch 335. Each ridge 330 has a body 331 that protrudes from a side wall of the enclosure cover 320 to form a cavity 339 with the outer surface of the side wall. The body 331 of the ridge 330 can have an inner perimeter with a shape that is substantially similar to that of an outer perimeter of the snap-fit fastener 440 that is part of the tamper-resistant coupling pair 270.

Also, to provide access to the specialized tool 590, the body 331 of the ridge 330 can have two or more gaps 340 along its top end. Each gap 340 extends through the entire height of the body 331 of the ridge 330. In some cases, a ridge 330 of a tamper-resistant coupling pair 270 can be formed from the enclosure cover 320 (e.g., using a straight pull method, using a side action method). In other cases, a ridge 330 can be formed as a separate piece (e.g., using a 3D printing process) and coupled (e.g., bolted, riveted, fused, melted) to the enclosure cover 320. When there are ridges 330 for an enclosure 201, one ridge 330 can be formed in the same way or a different way relative to one or more of the other ridges 330.

For example, in this case, the body 331-1 of the ridge 330-1 of tamper-resistant coupling pair 270-1 protrudes from the right side wall 323 to form an upside-down "U" shape. The shape of the inner perimeter of the body 331-1 of the ridge 330-1 is substantially the same as, and slightly larger than, the shape and size of the outer perimeter of the snap-fit fastener 440-1 that is part of the tamper-resistant coupling pair 270-1. The body 331-1 of the ridge 330-1 forms a cavity 339-1 with the outer surface of the right side wall 323. Also, to provide access to the specialized tool 590, the body 331-1 of the ridge 330-1 has two gaps 340-1 (gap 340-1-1 and gap 340-1-2) along its top end. Each gap 340-1 has a width 347 (width 347-1-1 for gap 340-1-1, width 347-1-2 for gap 340-1-2) that is at least wide enough to accommodate a corresponding tine 592 (discussed below) of the specialized tool 590. Each pair of adjacent gaps 340-1 is separated from each other by a distance 348, which is represented by a segment of the ridge 330-1.

Similarly, in this case, the body 331-2 of the ridge 330-2 of tamper-resistant coupling pair 270-2 protrudes from the left side wall 321 to form an upside-down "U" shape. The shape of the inner perimeter of the body 331-2 of the ridge 330-2 is substantially the same as, and slightly larger than, the shape and size of the outer perimeter of the snap-fit fastener 440-2 that is part of the tamper-resistant coupling pair 270-2. The body 331-2 of the ridge 330-2 forms a cavity 339-2 with the outer surface of the left side wall 321. Also, to provide access to the specialized tool 590, the body 331-2 of the ridge 330-2 has two gaps 340-2 (gap 340-2-1 and gap 340-2-2) along its top end. Each gap 340-2 has a width 347 that is at least wide enough to accommodate a corresponding tine 592 (discussed below) of the specialized tool 590. Each pair of adjacent gaps 340-2 is separated from each other by a distance 348, which is represented by a segment of the ridge 330-2.

In this case, ridge 330-1 and ridge 330-2 are configured substantially identically to each other. In alternative embodiments, when there are multiple tamper-resistant coupling pairs 270 of the tamper-resistant enclosure coupling system 110, one ridge 330 can have a configuration that is, at least in one respect (e.g., the height of the body 331 of the ridge 330, the shape of the body 331 of the ridge 330, the distance 343 that the body 331 of the ridge 330 extends from the side of the enclosure cover 320 (the depth of the cavity 339), the uniformity of the distance 343 that the body 331 of the ridge 330 extends from the side of the enclosure cover 320), different from a corresponding respect in one or more of the other ridges 330.

Also, while the ridges 330 and catches 335 of both tamper-resistant coupling pairs 270 of the tamper-resistant enclosure coupling system 110 are disposed on the enclosure cover 320 and the snap-fit fasteners 440 are disposed on the enclosure body 450 in this example, in alternative embodiments, one or more ridges 330 and catches 335 can be disposed on the enclosure body 450. In such cases, the one or more corresponding snap-fit fasteners 440 of each tamper-resistant coupling pair 270 of the tamper-resistant enclosure coupling system 110 can be disposed on the enclosure cover 320 rather than the enclosure body 450.

In certain example embodiments, some or all of the inner surface of the body 331 of a ridge 330 can include one or more features (e.g., detents, small protrusions) that are configured to complement a corresponding feature of the outer surface of the snap-fit fastener 440 that is disposed in the cavity 339 formed by the body 331 of the ridge 330. Such features can be used as a poka-yoke mechanism or mistake proofing for the tamper-resistant enclosure coupling system 110 or portions thereof. Alternatively, the inner surface of the body 331 of a ridge 330 can be featureless.

Each catch 335 of a tamper-resistant coupling pair 270 of the tamper-resistant enclosure coupling system 110 is configured to secure a snap-fit fastener 440 of the tamper-resistant coupling pair 270 by fitting within the aperture 449 that traverses the body 441 of the snap-fit fastener 440. A catch 335 can protrude from the side wall of the enclosure cover 320 and be located within the cavity 339 formed by the body 331 of the ridge 330. In other words, a catch 335 can be positioned within the inner perimeter of the body 331 of the ridge 330. A catch 335 can be configured to be positioned within the aperture 449 formed in the snap-fit fastener 440 and abut against the snap-fit fastener 440 when the snap-fit fastener 440 is disposed within the cavity 339 formed by the body 331 of the ridge 330.

A catch 335 can have any of a number of configurations. For example, in this case, each catch 335 has a lower portion 338 that is ramped (gradually increases in distance away from the side wall of the enclosure cover 320 up the height of the lower portion 338) and an upper portion 337 that is substantially parallel to the side wall of the enclosure cover 320. The top end 336 of the catch 335 in this case is substantially perpendicular to the side wall of the enclosure cover 320. In alternative embodiments, the top end 336 of the catch 335 can be off of perpendicular relative to the side wall of the enclosure cover 320. In some cases, a catch 335 of a tamper-resistant coupling pair 270 can be formed from the enclosure cover 320 (e.g., using a straight pull method, using a side action method). In other cases, a catch 335 can be formed as a separate piece (e.g., using a 3D printing process) and coupled (e.g., bolted, riveted, fused, melted) to the enclosure cover 320. When there are catches 335 for an enclosure 201, one catch 335 can be formed in the same way or a different way relative to one or more of the other catches 335.

For example, catch 335-1 of the tamper-resistant coupling pair 270-1 of the tamper-resistant enclosure coupling system 110 has a lower portion 338-1 that is ramped (gradually increases in distance away from the right side wall 323 of the enclosure cover 320 up the height of the lower portion 338-1) and an upper portion 337-1 that is substantially parallel to the right side wall 323 of the enclosure cover 320. The top end 336-1 of the catch 335-1 in this case is substantially perpendicular to the right side wall 323 of the enclosure cover 320.

Also in this example, catch 335-2 of the tamper-resistant coupling pair 270-2 of the tamper-resistant enclosure coupling system 110 has a lower portion 338-2 that is ramped (gradually increases in distance away from the left side wall 321 of the enclosure cover 320 up the height of the lower portion 338-2) and an upper portion 337-2 that is substantially parallel to the left side wall 321 of the enclosure cover 320. The top end 336-1 of the catch 335-1 in this case is substantially perpendicular to the left side wall 321 of the enclosure cover 320.

In certain example embodiments, some or all of the top end 336 of a catch 335 can include one or more features (e.g., detents, small protrusions) that are configured to complement a corresponding feature of the bottom surface of the snap-fit fastener 440 that bounds the top end of the aperture 449 that traverses the body 441 of the snap-fit fastener 440. Such features can be used as a poka-yoke mechanism or mistake proofing for the tamper-resistant enclosure coupling system 110 or portions thereof. Alternatively, the inner surface of the top end 336 of a catch 335 can be featureless. In some cases, a ridge 330, a catch 335, and the side wall of the enclosure cover 320 from which they extend are formed from a single piece.

The enclosure body 450 of the enclosure 201 can have any of a number of features and/or configurations. For example, in this case, the enclosure body 450 has five walls. Specifically, the enclosure body 450 has a bottom wall 455, a left side wall 451, a front wall 452, a right side wall 453, and a rear wall 454. As referred to herein, the left side wall 451, the front wall 452, the right side wall 453, and the rear wall 454 can collectively be called side walls and individually as a side wall or a side. Also, the top wall 455, the left side wall 451, the front wall 452, the right side wall 453, and the rear wall 454 can collectively be referred to as the body of the enclosure body 450.

This configuration of the enclosure body 450 in this case as a rectangular cuboid with an open-sided top. The body of the enclosure body 450 forms a cavity 465, inside of which the components of the enclosure 201 can be disposed when the enclosure cover 320 and the enclosure body 450 are coupled to each other. In alternative embodiments, the enclosure body 450 can have one side (as when the enclosure body 450 is in the shape of a cylinder), three sides, or more than four sides. The top wall 455 and/or one or more of the side walls of the enclosure body 450 can be substantially planar, as in this case. Alternatively, the top wall 455 and/or one or more of the side walls of the enclosure body 450 can be anti-planar (e.g., curved, arched). For example, if the enclosure body 450 is cylindrical in shape, then the top wall 455 can be substantially planar, and the side wall can be curved. As another example, if the enclosure body 450 is semi-spherical in shape, then the enclosure body 450 has only one wall.

The bottom edge of one or more of the sides (e.g., the left side wall 451, the front wall 452, the right side wall 453, the rear wall 454) of the enclosure body 450 can include one or more features (e.g., a channel for a sealing member (e.g., a gasket, silicone, an O-ring)) that help control the environment within the cavity 465 when the enclosure cover 320 is coupled to the enclosure body 450 and/or help align the enclosure cover 320 with respect to the enclosure body 450 when the enclosure cover 320 is coupled to the enclosure body 450. In certain example embodiments, the shape and size of the distal end of the sides of the enclosure cover 320 are substantially the same as the shape and size of the distal end of the sides of the enclosure body 450.

The enclosure body 450 can also include one or more standoffs 459 that extend upward within the cavity 465 from the inner surface of the top wall 455. The standoffs 459 can help align the enclosure cover 320 with respect to the enclosure body 450 when the enclosure cover 320 is coupled to the enclosure body 450. In this case, the enclosure body 450 has 5 standoffs 459. Depending on the purpose of the enclosure 201, the enclosure body 450 can additionally or alternatively have one or more other features that are not discussed here.

As discussed above, the enclosure body 450 includes part of one or more tamper-resistant coupling pairs 270 of the tamper-resistant enclosure coupling system 110. Specifically, in this case, the enclosure body 450 includes two snap-fit fasteners 440 (snap-fit fastener 440-1 and snap-fit fastener 440-2) that are part of the tamper-resistant enclosure coupling system 110. Specifically, snap-fit fastener 440-1 is part of one tamper-resistant coupling pair 270-1, and snap-fit fastener 440-2 is part of the other tamper-resistant coupling pair 270-2 in this example.

In this case, the snap-fit fasteners 440 are configured as loop hooks. When a snap-fit fastener 440 is configured as a loop hook, the loop hook can be configured using, for example, a cantilever design, a planar design, a trap design, or a torsional design. In alternative embodiments, a snap-fit fastener 440 can have any of a number of other configurations, including but not limited to a snap arm joint, a torsional snap joint, and a ring-shaped snap joint. In any case, the configuration of a snap-fit fastener 440 can complement the configuration of other parts (e.g., a catch 335, a ridge 330) of a tamper-resistant coupling pair 270. Conversely, the configuration of a catch 335 and/or a ridge 330 can complement the configuration of other parts (e.g., snap-fit fastener 440) of a tamper-resistant coupling pair 270. When the tamper-resistant enclosure coupling system 110 of an enclosure 201 has multiple tamper-resistant coupling pairs 270, the composition and configuration of one component (e.g., a snap-fit fastener 440, a catch 335, a ridge 330) of one tamper-resistant coupling pair 270 can be configured the same as, or differently relative to, the corresponding component of another tamper-resistant coupling pair 270.

In some cases, as in this example, the enclosure body 450 can have more snap-fit fasteners 440 than the number of tamper-resistant coupling pairs 270. In this case, the enclosure body 450 has four snap-fit fasteners 440, where snap-fit fastener 440-1 and snap-fit fastener 440-2 are part of the tamper-resistant enclosure coupling system 110, and snap-fit fastener 440-3 and snap-fit fastener 440-4 are not part of the tamper-resistant enclosure coupling system 110. Because of the configurations of the snap-fit fasteners 440 and the catches 335, when ridge 330-1 and catch 335-1 engage snap-fit fastener 440-1, and when ridge 330-2 and catch 335-2 engage snap-fit fastener 440-2, catch 335-3 engages snap-fit fastener 440-3, and catch 335-4 engages snap-fit fastener 440-4. However, because there are no ridges that correspond with catch 335-3, snap-fit fastener 440-3, catch 335-4, and snap-fit fastener 440-4, the coupling pair of catch 335-3 and snap-fit fastener 440-3, and the coupling pair of catch 335-4 and snap-fit fastener 440-4, are not tamper-resistant because the top end of snap-fit fastener 440-3 and snap-fit fastener 440-4 are easily accessible to disengage them from the catch 335-3 and the catch 335-4, respectively.

Each snap-fit fastener 440 is configured to abut against and engage a catch 335. When a snap-fit fastener 440 is part of a tamper-resistant coupling pair 270, the snap-fit fastener 440 is also configured to abut against the inner perimeter of the ridge 330 of the tamper-resistant coupling pair 270 when the snap-fit fastener 440 is positioned within the cavity 339 formed by the ridge 330 with the side wall of the enclosure cover 320. Each snap-fit fastener 440 has a body 441 that extends upward from a side wall of the enclosure body 450. The body 441 of each snap-fit fastener 440 has an aperture 449 that traverses therethrough, where the bottom of the aperture 449 is bounded by the top edge of the side wall from which the body 441 extends.

The shape and size of the aperture 449 of each snap-fit fastener 440 can be substantially similar to, but slightly larger than, the shape and size of the catch 335 that the snap-fit fastener 440 engages, regardless of whether the snap-fit fastener 440 is part of a tamper-resistant coupling pair 270. Also, the shape and size of the outer perimeter of the body 441 can be substantially the same as, but slightly smaller than, the shape and size of the ridge 330 that the snap-fit fastener 440 engages, provided that the snap-fit fastener 440 is part of a tamper-resistant coupling pair 270. Also, if the snap-fit fastener 440 is part of a tamper-resistant coupling pair 270, the thickness 467 of the snap-fit fastener 440 can be substantially the same as the depth of the cavity 339 formed by the ridge 330. Such a close fit can minimize the opportunity for a user to gain unauthorized access to the contents of the enclosure 201 without the tool 590.

Each snap-fit fastener 440 can be formed in one or more of any of a number of ways. For example, in this case, each snap-fit fastener 440 can be formed by side-action molding. In this way, there is a channel 444 that results, where the channel 444 extends along the height of the side wall of the enclosure body 450 from which the snap-fit fastener 440 extends. In alternative embodiments, a snap-fit fastener 440 can be formed using a straight pull method. In yet other alternative embodiments, a snap-fit fastener 440 can be formed as a separate piece (e.g., using a 3D printing process) and coupled (e.g., bolted, riveted, fused, melted) to the enclosure body 450. When there are multiple snap-fit fasteners 440, one snap-fit fastener 440 can be formed in the same way or a different way relative to one or more of the other snap-fit fasteners 440. The channel 444 can be tapered so that the width of the channel 444 decreases as the channel 444 approaches the distal (top) end of the side wall in which the channel 444 is disposed.

For example, in this case, the snap-fit fastener 440-1 is part of tamper-resistant coupling pair 270-1. The snap-fit fastener 440-1 has a body 441-1 that extends upward from the side wall 453 of the enclosure body 450. The body 441-1 of the snap-fit fastener 440-1 has an aperture 449-1 that traverses therethrough, where the bottom of the aperture 449-1 is bounded by the top edge of the side wall 453. The shape and size of the aperture 449-1 of the snap-fit fastener 440-1 is substantially similar to, but slightly larger than, the shape and size of the catch 335-1 that the snap-fit fastener 440-1 engages. Also, the shape and size of the outer perimeter of the body 441-1 is substantially the same as, but slightly smaller than, the shape and size of the ridge 330-1 that the snap-fit fastener 440-1 engages.

Further, the thickness 467 of the snap-fit fastener 440-1 can be substantially the same as the depth of the cavity 339-1 (the distance 343 that the body 331-1 of the ridge 330-1 extends from the side wall 453) formed by the ridge 330-1 as well as the distance that the upper portion 337-1 of the catch 335-1 extends from the side wall 453. This allows for a substantially planar surface between the outer surfaces of the body 331-1 of the ridge 330-1, the body 441-1 of the snap-fit fastener 440-1, and the upper portion 337-1 of the catch 335-1 when the tamper-resistant coupling pair 270-1 is engaged. The snap-fit fastener 440-1 is formed by side-action molding, which results in the formation of a channel 444-1 that extends along the height of the side wall 453 of the enclosure body 450 from which the snap-fit fastener 440-1 extends. The channel 444-1 is tapered so that the width of the channel 444-1 decreases as the channel 444-1 approaches the distal (top) end of the side wall 453.

As another example, in this case, the snap-fit fastener 440-2 is part of tamper-resistant coupling pair 270-2. The snap-fit fastener 440-2 has a body 441-2 that extends upward from the side wall 451 of the enclosure body 450. The body 441-2 of the snap-fit fastener 440-2 has an aperture 449-2 that traverses therethrough, where the bottom of the aperture 449-2 is bounded by the top edge of the side wall 451. The shape and size of the aperture 449-2 of the snap-fit fastener 440-2 is substantially similar to, but slightly larger than, the shape and size of the catch 335-2 that the snap-fit fastener 440-2 engages. Also, the shape and size of the outer perimeter of the body 441-2 is substantially the same as, but slightly smaller than, the shape and size of the ridge 330-2 that the snap-fit fastener 440-2 engages.

Further, the thickness 467 of the snap-fit fastener 440-2 can be substantially the same as the depth of the cavity 339-2 (the distance 343 that the body 331-2 of the ridge 330-2 extends from the side wall 451) formed by the ridge 330-2 as well as the distance that the upper portion 337-2 of the catch 335-2 extends from the side wall 451. This allows for a substantially planar surface between the outer surfaces of the body 331-2 of the ridge 330-2, the body 441-2 of the snap-fit fastener 440-2, and the upper portion 337-2 of the catch 335-2 when the tamper-resistant coupling pair 270-2 is engaged. The snap-fit fastener 440-2 is formed by side-action molding, which results in the formation of a channel 444-2 that extends along the height of the side wall 451 of the enclosure body 450 from which the snap-fit fastener 440-2 extends. The channel 444-2 is tapered so that the width of the channel 444-2 decreases as the channel 444-2 approaches the distal (top) end of the side wall 451.

As still another example, in this case, the snap-fit fastener 440-3 is not part of a tamper-resistant coupling pair 270. The snap-fit fastener 440-3 has a body 441-3 that extends upward from the side wall 454 of the enclosure body 450. The body 441-3 of the snap-fit fastener 440-3 has an aperture 449-3 that traverses therethrough, where the bottom of the aperture 449-3 is bounded by the top edge of the side wall 454. The shape and size of the aperture 449-3 of the snap-fit fastener 440-3 is substantially similar to, but slightly larger than, the shape and size of the catch 335-3 that the snap-fit fastener 440-3 engages. Since there is no ridge 330 disposed on the side wall 454, the shape and size of the outer perimeter of the body 441-3 is not relevant.

Also, the thickness 467 of the snap-fit fastener 440-3 can be substantially the same as the distance that the upper portion of the catch 335-3. This allows for a substantially planar surface between the outer surfaces of the body 441-3 of the snap-fit fastener 440-3 and the upper portion of the catch 335-3 when the snap-fit fastener 440-3 and the catch 335-3 are engaged with (coupled to) each other. The snap-fit fastener 440-3 is formed by side-action molding, which results in the formation of a channel 444-3 that extends along the height of the side wall 454 of the enclosure body 450 from which the snap-fit fastener 440-3 extends. The channel 444-3 is tapered so that the width of the channel 444-3 decreases as the channel 444-3 approaches the distal (top) end of the side wall 454.

As yet another example, in this case, the snap-fit fastener 440-4 is not part of a tamper-resistant coupling pair 270. The snap-fit fastener 440-4 has a body 441-4 that extends upward from the side wall 452 of the enclosure body 450. The body 441-4 of the snap-fit fastener 440-4 has an aperture 449-4 that traverses therethrough, where the bottom of the aperture 449-4 is bounded by the top edge of the side wall 452. The shape and size of the aperture 449-4 of the snap-fit fastener 440-4 is substantially similar to, but slightly larger than, the shape and size of the catch 335-4 that the snap-fit fastener 440-4 engages. Since there is no ridge 330 disposed on the side wall 452, the shape and size of the outer perimeter of the body 441-4 is not relevant.

Also, the thickness 467 of the snap-fit fastener 440-4 can be substantially the same as the distance that the upper portion of the catch 335-4. This allows for a substantially planar surface between the outer surfaces of the body 441-4 of the snap-fit fastener 440-4 and the upper portion of the catch 335-4 when the snap-fit fastener 440-4 and the catch 335-4 are engaged with (coupled to) each other. The snap-fit fastener 440-4 is formed by side-action molding, which results in the formation of a channel 444-4 that extends along the height of the side wall 452 of the enclosure body 450 from which the snap-fit fastener 440-4 extends. The channel 444-4 is tapered so that the width of the channel 444-4 decreases as the channel 444-4 approaches the distal (top) end of the side wall 452.

In this case, snap-fit fastener 440-1, snap-fit fastener 440-2, snap-fit fastener 440-3, and snap-fit fastener 440-4 are configured substantially identically to each other. In alternative embodiments, when there are multiple snap-fit fasteners 440, one or more of the characteristics (e.g., the height of the body 441, the shape of the body 441, the thickness of the body 441, the shape of the aperture 449, the size of the aperture 449) of one snap-fit fastener 440 can differ from one or more of the corresponding characteristics of one or more of the other snap-fit fasteners 440.

In certain example embodiments, some or all of the top inner surface of the aperture 449 in the body 441 of a snap-fit fastener 440 can include one or more features (e.g., detents, small protrusions) that are configured to complement a corresponding feature of the top end 336 of the catch 335 that is disposed in the aperture 449 and engages the body 441 of the snap-fit fastener 440. Alternatively, the top inner surface of the aperture 449 in the body 441 of a snap-fit fastener 440 can be featureless.

Regardless of the shape (e.g., semi-spherical, cylindrical, rectangular cuboid) of the enclosure body 450 and the enclosure cover 320, the enclosure 201 can have only one tamper-resistant coupling pair 270. In such a case, the enclosure 201 can have another type of tamper-resistant coupling feature (e.g., a hidden hinge) on a side or end of the enclosure 201 that is substantially opposite of where the tamper-resistant coupling pair 270 is located. Alternatively, as in this example, the enclosure 201 can have multiple (e.g., 2, 3, 4, 6, 8, 11) tamper-resistant coupling pairs 270. In such cases, the enclosure 201 can additionally have one or more other types of coupling feature pairs that are not tamper-resistant, as in this example, and/or another type of tamper-resistant coupling feature (e.g., a hidden hinge).

FIGS. 5A through 5C show various views of the tool 590 of the tamper-resistant enclosure coupling system 110 of FIG. 1 according to certain example embodiments. Specifically, FIG. 5A shows a front-side perspective view of the tool 590. FIG. 5B shows a side view of the tool 590. FIG. 5C shows a front view of the tool 590. Referring to FIGS. 1 through 5C, the tool 590 is a specialized device configured to separate each of the tamper-resistant coupling pairs 270 of the enclosure 201. The tool 590 has multiple components and/or features. For example, as shown in FIGS. 5A through 5C, the tool 590 can have a main body 591 and multiple sloped tines 592 that extend away from the distal end of the main body 591. In this case, the tool 590 has two sloped tines 592 (sloped tine 592-1 and sloped tine 592-2). In alternative embodiments, the tool 590 can have more than two sloped tines 592. In certain example embodiments, the number of sloped tines 592 of the tool 590 matches the number of gaps 340 in the ridge 330 of each tamper-resistant coupling pair 270.

The sloped tines 592 are separated from each other by a distance 598, which is substantially the same as or slightly larger than the distance 348 between adjacent gaps 340 in the body 331 of a ridge 330. Each sloped tine 592 of the tool 590 has a tine body 595 that is adjacent to the main body 591 of the tool 590. Each tine body 595 has a width 597 (a side-to-side distance), a length 596, and a thickness 599 (a front-to-back distance). Toward the distal end 594 of each tine body 595 is a sloped portion 593, which has a gradually reduced thickness 599 until reaching the distal end 594. The sloped portion 593 of a sloped tine 592 can be planar, as in this example. Alternatively, the sloped portion 593 can have a non-planar surface.

In this case, the sloped tine 592-1 of the tool 590 has a tine body 595-1 that is adjacent to the main body 591 of the tool 590. The tine body 595-1 has a width 597-1 (a side-to-side distance), a length 596, and a thickness 599 (a front-to-back distance). Toward the distal end 594-1 of the tine body 595-1 is a sloped portion 593-1, which has a gradually reduced thickness 599 until reaching the distal end 594-1. The sloped portion 593-1 of the sloped tine 592-1 is planar.

Further, in this case, the sloped tine 592-2 of the tool 590 has a tine body 595-2 that is adjacent to the main body 591 of the tool 590. The tine body 595-2 has a width 597-2 (a side-to-side distance), a length 596, and a thickness 599 (a front-to-back distance). Toward the distal end 594-2 of the tine body 595-2 is a sloped portion 593-2, which has a gradually reduced thickness 599 until reaching the distal end 594-2. The sloped portion 593-2 of the sloped tine 592-2 is planar.

The shape (e.g., slope of the sloped portion 593) and size (e.g., thickness 599, length 596, width 597) of the sloped tines 592 in this case are substantially identical to each other. In alternative embodiments, the shape, size, and/or other characteristics of one sloped tine 592 can differ from a corresponding characteristic of at least one other sloped tine 592. The configuration of each of the sloped tines 592 of the tool 590 is designed to allow the sloped tines 592 to substantially simultaneously push through the gaps 340 along the top end of the ridge 330 of one of the tamper-resistant coupling pairs 270. When this occurs, the sloped tines 592 can wedge and push outward a top end of the body 441 of the snap-fit fastener 440 of the tamper-resistant coupling pair 270 out of the cavity 339 formed by the ridge 330 and separate the snap-fit fastener 440 from the catch 335 of the tamper-resistant coupling pair 270. This allows the enclosure cover 320 and the enclosure body 450 to become separated at the location of the tamper-resistant coupling pair 270.

Figure 6:
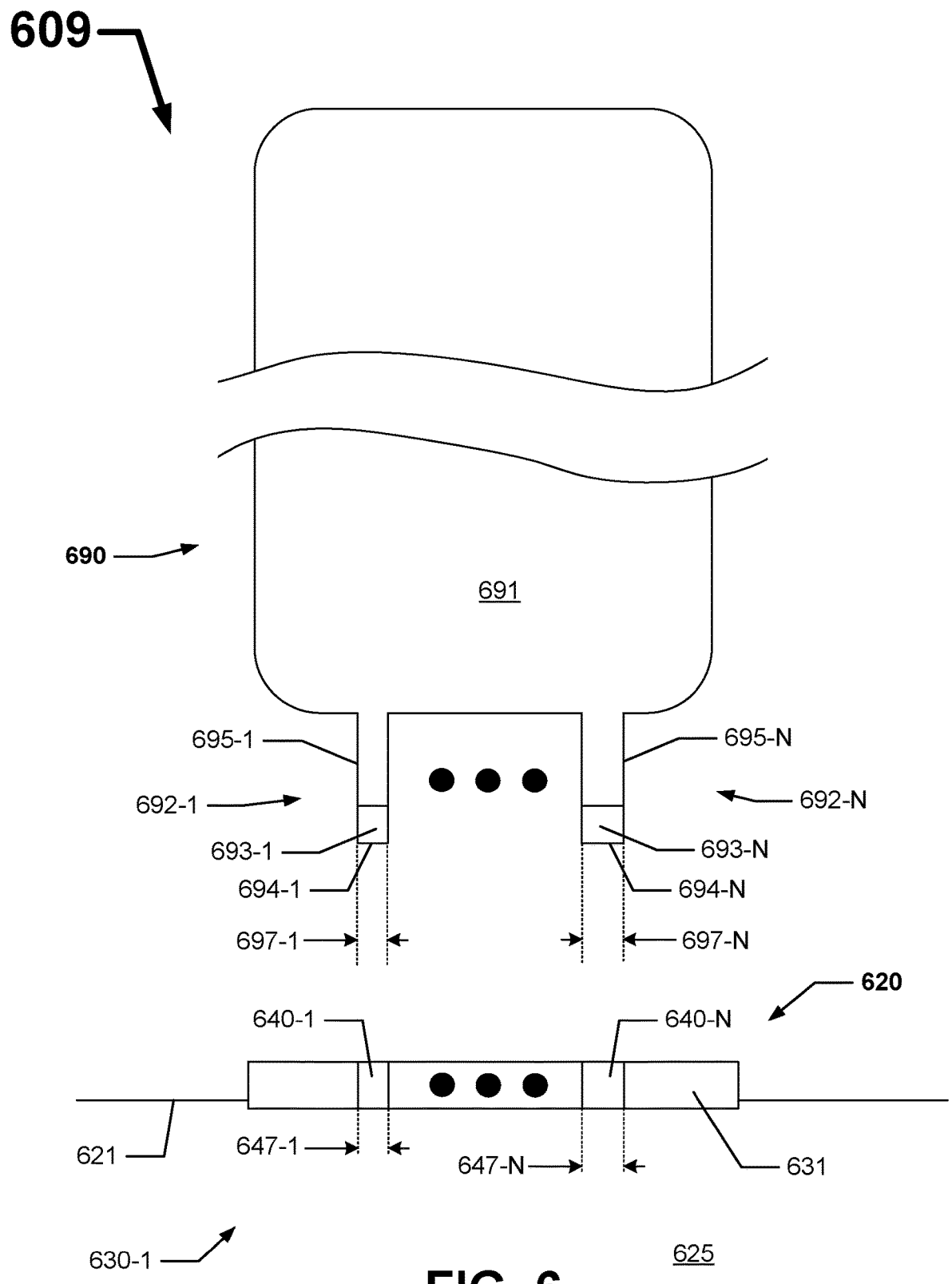
FIG. 6 shows a diagram of portion of a tamper-resistant enclosure coupling system according to certain example embodiments.

FIG. 6 shows a diagram of a portion 609 of a tamper-resistant enclosure coupling system according to certain example embodiments. Referring to FIGS. 1 through 6, the portion 609 of the tamper-resistant enclosure coupling system (e.g., tamper-resistant enclosure coupling system 110) of FIG. 6 includes part of an enclosure cover 620 and a tool 690. The part of the enclosure cover 620 includes part of the top wall 625, part of side wall 621, and a top view of a ridge 630-1. The top wall 625, the side wall 621, the ridge 630-1, the enclosure cover 620, and the tool 690 of FIG. 6 can be substantially the same as the top wall 325, the side wall 321, the ridges 330, the enclosure cover 320, and the tool 590 discussed above. In this case, there are N (e.g., N=2, N=3, N=5) gaps 640 (gap 640-1 through gap 640-N) in the top of the body 631 of the ridge 630. Gap 640-1 has a width 647-1, and gap 640-N has a width 647-N. In this case, width 647-1 and width 647-N are different from each other.

The tool 690 of the portion 609 of the tamper-resistant enclosure coupling system of FIG. 6 includes a main body 691 and N (e.g., N=2, N=3, N=5) sloped tines 692 (sloped tine 692-1 through sloped tine 692-N) that extend away from the distal end of the main body 691. The number of sloped tines 692 of the tool 690 matches the number of gaps 640 in the ridge 630. In this case, the sloped tine 692-1 of the tool 690 has a tine body 695-1 that is adjacent to the main body 691 of the tool 690. The tine body 695-1 has a width 697-1 (a side-to-side distance) that is slightly less than the width 647-1 of the gap 640-1 in the ridge 630. Toward the distal end 694-1 of the tine body 695-1 is a sloped portion 693-1. The sloped portion 693-1 of the sloped tine 692-1 is planar in this case, but in alternative embodiments the sloped portion 693-1 can have a different (e.g., curved) configuration.

Further, in this case, the sloped tine 692-N of the tool 690 has a tine body 695-N that is adjacent to the main body 691 of the tool 690. The tine body 695-N has a width 697-N (a side-to-side distance) that is slightly less than the width 647-N of the gap 640-N in the ridge 630. The width 697-N of the sloped tine 692-1 can be the same as, or different than (e.g., greater than, less than) the width 697-1 of the sloped tine 692-N. Toward the distal end 694-N of the tine body 695-N is a sloped portion 693-N. The sloped portion 693-N of the sloped tine 692-N is planar in this case, but in alternative embodiments the sloped portion 693-1 can have a different (e.g., curved) configuration. The configuration of one sloped portion 693 (e.g., sloped portion 693-N) can be the same as, or different than, the configuration of another sloped portion 693 (e.g., sloped portion 693-1) of the tool 690.

Example embodiments can be used to provide a tamper-resistant coupling system for enclosures. Example embodiments can be utilized with any type of enclosure and/or in any type of environment. Example embodiments require a specialized tool to allow the tamper-resistant coupling features of the tamper-resistant coupling system to become disengaged. Example embodiments provide a number of other benefits. Such benefits can include, but are not limited to, increased ease of maintenance, greater ease of use, increased reliability, ease of installation, and compliance with industry standards that apply to enclosures.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

The invention claimed is:
1. An enclosure comprising:
  a first enclosure component comprising:
    a first enclosure component side; and a snap-fit fastener that extends from the first enclosure component side, wherein the snap-fit fastener comprises a body with an aperture that traverses therethrough; and a second enclosure component comprising:

a second enclosure component side;

a ridge that protrudes from the second enclosure component side to form a cavity, wherein the ridge has an inner perimeter with a shape that is substantially similar to that of an outer perimeter of the snap-fit fastener, wherein the outer perimeter of the snap-fit fastener is configured to abut against the inner perimeter of the ridge when the snap-fit fastener is positioned within the cavity, and wherein the ridge has a plurality of gaps along its top end; and a catch that protrudes from the second enclosure component side, wherein the catch is positioned within the inner perimeter of the ridge, and wherein the catch is configured to be positioned within the aperture formed by the snap-fit fastener and abut against the snap-fit fastener when the snap-fit fastener is disposed within the cavity formed by the ridge, wherein the catch and the snap-fit fastener remain engaged with each other until a plurality of sloped tines of a tool are substantially simultaneously pushed through the plurality of gaps along the top end of the ridge, and wherein the plurality of sloped tines wedge a top end of the snap-fit fastener out of the cavity and separate the snap-fit fastener from the catch.

2. The enclosure of claim 1, wherein the first enclosure component further comprises an additional snap-fit fastener that extends from the first enclosure component side of the first enclosure component, wherein the additional snap-fit fastener comprises an additional body with an additional aperture that traverses therethrough, and wherein the additional snap-fit fastener is positioned substantially opposite the snap-fit fastener with respect to the first enclosure component.

3. The enclosure of claim 2, wherein the second enclosure component further comprises an additional ridge and an additional catch, wherein the additional ridge protrudes from the second enclosure component side to form an additional cavity, wherein the additional ridge has the inner perimeter with the shape that is substantially similar to that of the outer perimeter of the additional snap-fit fastener, wherein the outer perimeter of the additional snap-fit fastener is configured to abut against the inner perimeter of the additional ridge when the additional snap-fit fastener is positioned within the additional cavity, wherein the additional ridge has an additional plurality of gaps along its top end, wherein the additional catch protrudes from the second enclosure component side, wherein the additional catch is positioned within the inner perimeter of the additional ridge, wherein the additional catch is configured to be positioned within the additional aperture formed by the snap-fit fastener and abut against the additional snap-fit fastener when the additional snap-fit fastener is disposed within the additional cavity formed by the additional ridge, and wherein the additional ridge and the additional catch are positioned substantially opposite the ridge and the catch with respect to the second enclosure component.

4. The enclosure of claim 1, wherein the snap-fit fastener is formed by side-action molding.

5. The enclosure of claim 1, wherein the first enclosure component and the second enclosure component, when coupled to each other using the snap-fit fastener, the ridge, and the catch, forms a Class 1 enclosure.

6. A tamper-resistant enclosure coupling system for an enclosure, the tamper-resistant coupling system comprising:

a snap-fit fastener that extends from a first enclosure component side of a first enclosure component of the enclosure, wherein the snap-fit fastener comprises a body with an aperture that traverses therethrough;

a ridge that protrudes from a second enclosure component side of a second enclosure component of the enclosure to form a cavity, wherein the ridge has an inner perimeter with a shape that is substantially similar to that of an outer perimeter of the snap-fit fastener, wherein the outer perimeter of the snap-fit fastener is configured to abut against the inner perimeter of the ridge when the snap-fit fastener is positioned within the cavity, and wherein the ridge has a plurality of gaps along its top end;

a catch that protrudes from the second enclosure component side, wherein the catch is positioned within the inner perimeter of the ridge, and wherein the catch is configured to be positioned within the aperture of the snap-fit fastener and abut against the snap-fit fastener when the snap-fit fastener is disposed within the cavity formed by the ridge; and a tool comprising a plurality of sloped tines, wherein each of the plurality of sloped tines has a width that is no greater than a width of a corresponding one of the plurality of gaps in the top end of the ridge, wherein the catch and the snap-fit fastener remain engaged with each other until the plurality of sloped tines of the tool are substantially simultaneously pushed through the plurality of gaps along the top end of the ridge, and wherein the plurality of sloped tines wedge a top end of the snap-fit fastener out of the cavity and separate the snap-fit fastener from the catch.

7. The tamper-resistant enclosure coupling system of claim 6, wherein the ridge forms an upside-down "U" shape on the second enclosure component side.

8. The tamper-resistant enclosure coupling system of claim 6, wherein snap-fit fastener is formed by a straight pull molding process with respect to the first enclosure component side.

9. The tamper-resistant enclosure coupling system of claim 6, wherein the ridge, the catch, and the second enclosure component side form a single piece.

10. The tamper-resistant enclosure coupling system of claim 6, further comprising:

an additional snap-fit fastener that extends from the first enclosure component side of the first enclosure component of the enclosure, wherein the additional snap-fit fastener comprises an additional body with an additional aperture that traverses therethrough.

11. The tamper-resistant enclosure coupling system of claim 10, further comprising:

an additional ridge that protrudes from the second enclosure component side of the second enclosure component of the enclosure to form an additional cavity, wherein the additional ridge has the inner perimeter with the shape that is substantially similar to that of the outer perimeter of the additional snap-fit fastener, wherein the outer perimeter of the additional snap-fit fastener is configured to abut against the inner perimeter of the additional ridge when the additional snap-fit fastener is positioned within the additional cavity, and wherein the additional ridge has an additional plurality of gaps along its top end; and an additional catch that protrudes from the second enclosure component side, wherein the additional catch is positioned within the inner perimeter of the additional ridge, and wherein the additional catch is configured to be positioned within and abut against the additional snap-fit fastener when the additional snap-fit fastener is disposed within the additional cavity formed by the additional ridge.

12. The tamper-resistant enclosure coupling system of claim 6, wherein the snap-fit fastener, the ridge, and the catch form a substantially planar outer surface when the snap-fit fastener is disposed within the cavity formed by the ridge.

13. The tamper-resistant enclosure coupling system of claim 6, further comprising:
   a tool comprising a plurality of sloped tines, wherein each of the plurality of sloped tines has a width that is no greater than a width of a corresponding one of the plurality of gaps in the top end of the ridge, wherein the catch and the snap-fit fastener remain engaged with each other until the plurality of sloped tines of the tool are substantially simultaneously pushed through the plurality of gaps along the top end of the ridge, and wherein the plurality of sloped tines wedge a top end of the snap-fit fastener out of the cavity and separate the snap-fit fastener from the catch.

14. The tamper-resistant enclosure coupling system of claim 6, wherein the plurality of sloped tines and the plurality of gaps have a same count.

* * * * *